(12) United States Patent
Wang et al.

(10) Patent No.: US 10,163,710 B2
(45) Date of Patent: Dec. 25, 2018

(54) METHOD OF MANUFACTURING SEMICONDUCTOR DEVICE BY APPLYING MOLDING LAYER IN SUBSTRATE GROOVE

(71) Applicant: TAIWAN SEMICONDUCTOR MANUFACTURING COMPANY, LTD., Hsinchu (TW)

(72) Inventors: Tsung-Ding Wang, Tainan (TW); Jung Wei Cheng, Hsinchu (TW); Bo-I Lee, Sindian (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/217,032

(22) Filed: Jul. 22, 2016

(65) Prior Publication Data
US 2016/0329247 A1   Nov. 10, 2016

Related U.S. Application Data

(60) Division of application No. 14/452,219, filed on Aug. 5, 2014, now Pat. No. 9,406,632, which is a
(Continued)

(51) Int. Cl.
*H01L 21/56* (2006.01)
*H01L 21/78* (2006.01)
(Continued)

(52) U.S. Cl.
CPC ............ *H01L 21/78* (2013.01); *H01L 21/563* (2013.01); *H01L 21/565* (2013.01);
(Continued)

(58) Field of Classification Search
None
See application file for complete search history.

(56) References Cited

U.S. PATENT DOCUMENTS

| 6,107,164 A | 8/2000 | Ohuchi |
| 6,338,980 B1 | 1/2002 | Satoh |
| (Continued) | | |

FOREIGN PATENT DOCUMENTS

CN   101339910   1/2009

OTHER PUBLICATIONS

Office Action dated Jun. 12, 2016 from corresponding No. CN 201210519648.0.

*Primary Examiner* — Jay C Chang
(74) *Attorney, Agent, or Firm* — Hauptman Ham, LLP

(57) ABSTRACT

A method of forming a semiconductor package includes depositing a passivation layer overlying a semiconductor substrate, wherein the semiconductor substrate includes a scribe line region positioned between a first chip region and a second chip region. The method further includes forming a bump overlying the passivation layer on at least one of the first chip region or the second chip region, wherein the bump comprises a copper pillar and a cap layer. The method further includes forming a groove passing through the passivation layer on the scribe line region, wherein the groove extends into the semiconductor substrate to expose a stepped sidewall of the semiconductor substrate. The method further includes applying a molding compound layer to cover the passivation layer and a lower portion of the bump and fill the groove. The method further includes singulating along the scribe line region.

20 Claims, 12 Drawing Sheets

Related U.S. Application Data continuation-in-part of application No. 13/585,500, filed on Aug. 14, 2012, now Pat. No. 9,275,924.

(51) Int. Cl.
*H01L 23/00* (2006.01)
*H01L 23/31* (2006.01)
*H01L 23/544* (2006.01)

(52) U.S. Cl.
CPC ...... *H01L 23/3128* (2013.01); *H01L 23/3171* (2013.01); *H01L 23/3178* (2013.01); *H01L 23/3185* (2013.01); *H01L 23/544* (2013.01); *H01L 24/11* (2013.01); *H01L 24/13* (2013.01); *H01L 24/94* (2013.01); *H01L 21/561* (2013.01); *H01L 23/3114* (2013.01); *H01L 23/3192* (2013.01); *H01L 24/03* (2013.01); *H01L 24/05* (2013.01); *H01L 2223/5446* (2013.01); *H01L 2224/0401* (2013.01); *H01L 2224/05009* (2013.01); *H01L 2224/05022* (2013.01); *H01L 2224/0558* (2013.01); *H01L 2224/05572* (2013.01); *H01L 2224/05611* (2013.01); *H01L 2224/05644* (2013.01); *H01L 2224/05647* (2013.01); *H01L 2224/05655* (2013.01); *H01L 2224/05666* (2013.01); *H01L 2224/05681* (2013.01); *H01L 2224/05686* (2013.01); *H01L 2224/1191* (2013.01); *H01L 2224/11334* (2013.01); *H01L 2224/11849* (2013.01); *H01L 2224/13005* (2013.01); *H01L 2224/13022* (2013.01); *H01L 2224/13082* (2013.01); *H01L 2224/13109* (2013.01); *H01L 2224/13111* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/94* (2013.01); *H01L 2924/0105* (2013.01); *H01L 2924/01022* (2013.01); *H01L 2924/01028* (2013.01); *H01L 2924/01029* (2013.01); *H01L 2924/01079* (2013.01); *H01L 2924/10156* (2013.01); *H01L 2924/12042* (2013.01); *H01L 2924/181* (2013.01); *H01L 2924/381* (2013.01)

(56) References Cited

U.S. PATENT DOCUMENTS

| | | |
|---|---|---|
| 6,607,970 B1 | 8/2003 | Wakabayashi |
| 2005/0148160 A1 | 7/2005 | Farnworth et al. |
| 2006/0079025 A1 | 4/2006 | Kripesh et al. |
| 2006/0217499 A1* | 9/2006 | Takenaka ............. C08G 59/188 525/533 |
| 2008/0054461 A1 | 3/2008 | Lang et al. |
| 2009/0011543 A1* | 1/2009 | Karta .................... H01L 21/561 438/114 |
| 2009/0243097 A1* | 10/2009 | Koroku ................ H01L 21/561 257/737 |
| 2010/0273312 A1 | 10/2010 | Noda |
| 2013/0037935 A1 | 2/2013 | Xue |

\* cited by examiner

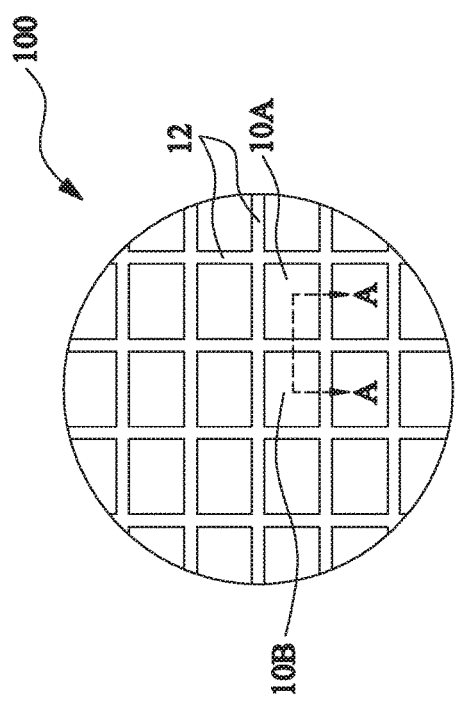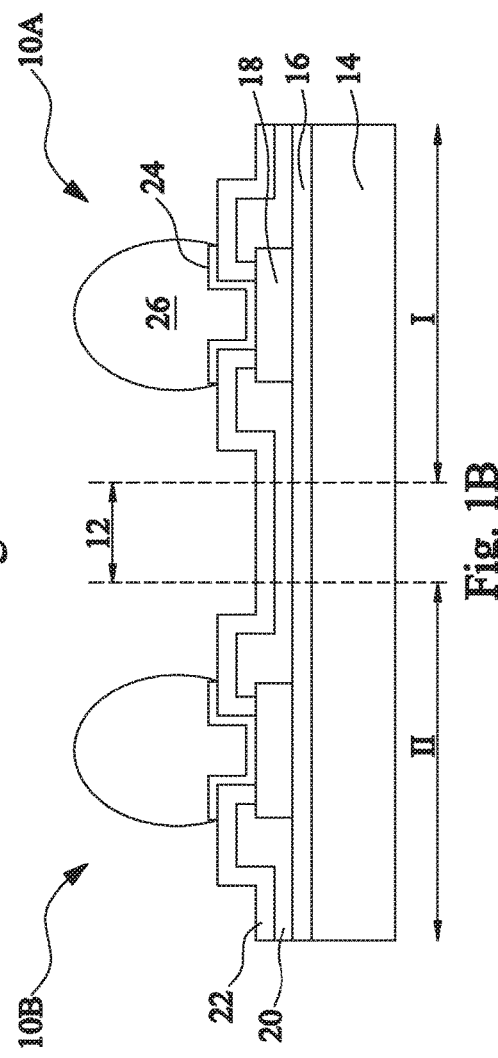
Fig. 1A
Fig. 1B

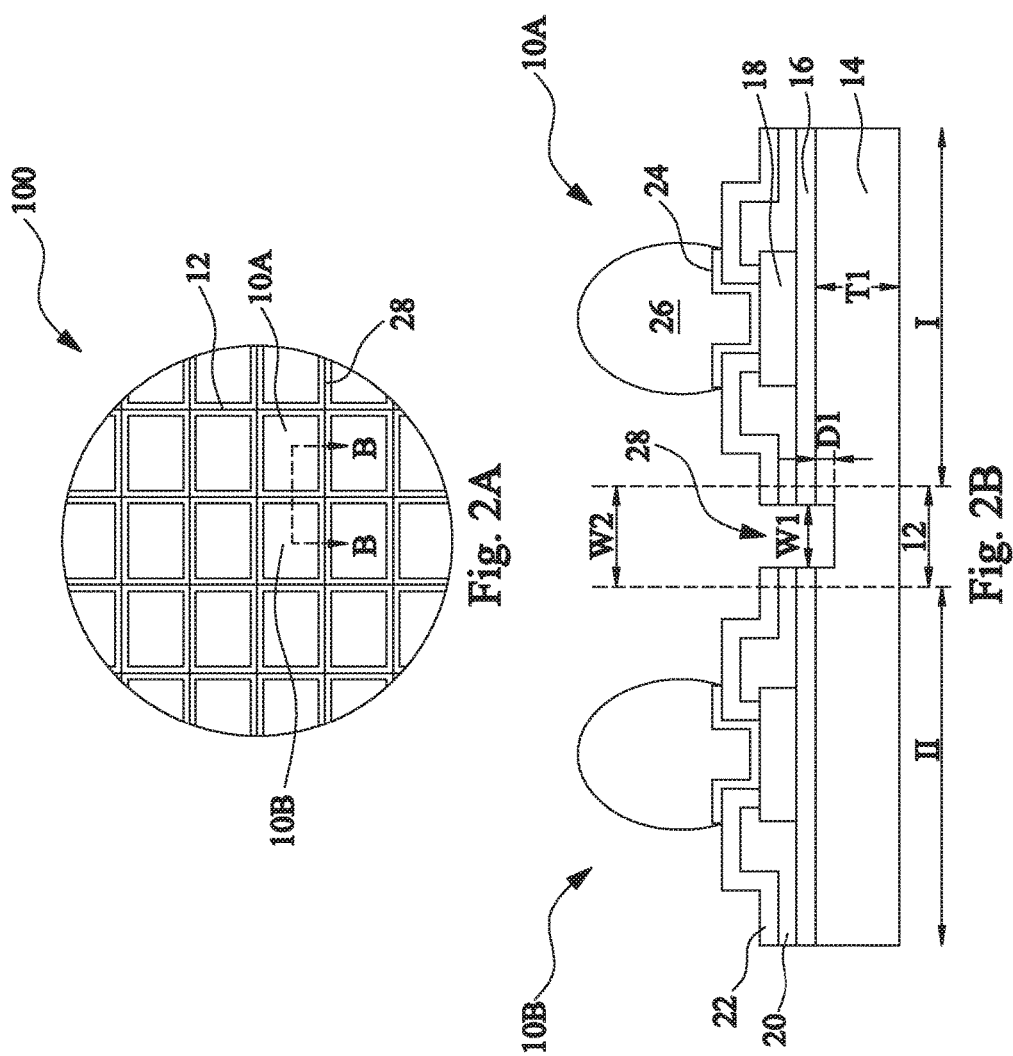

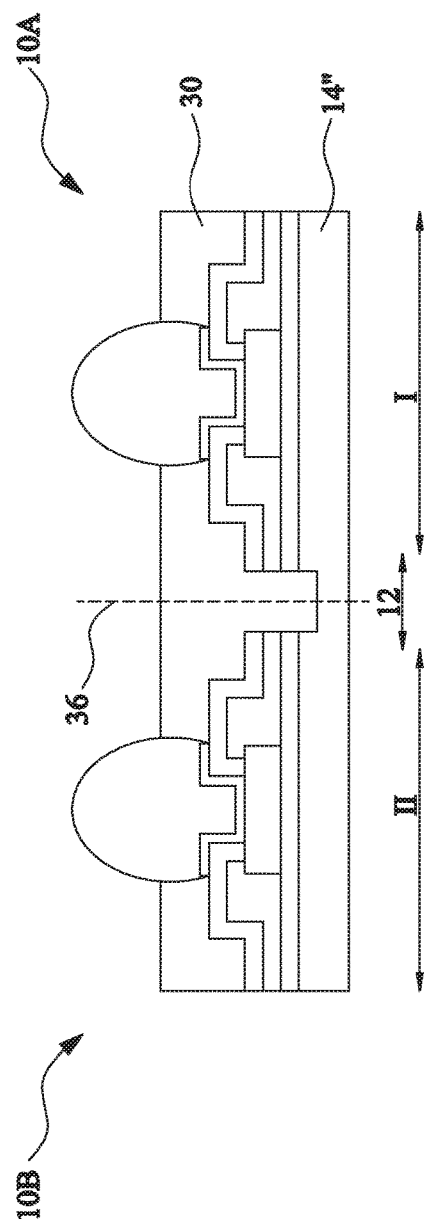
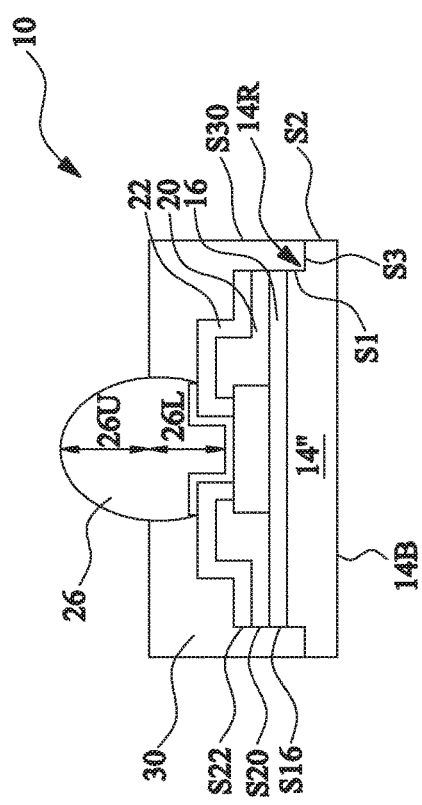

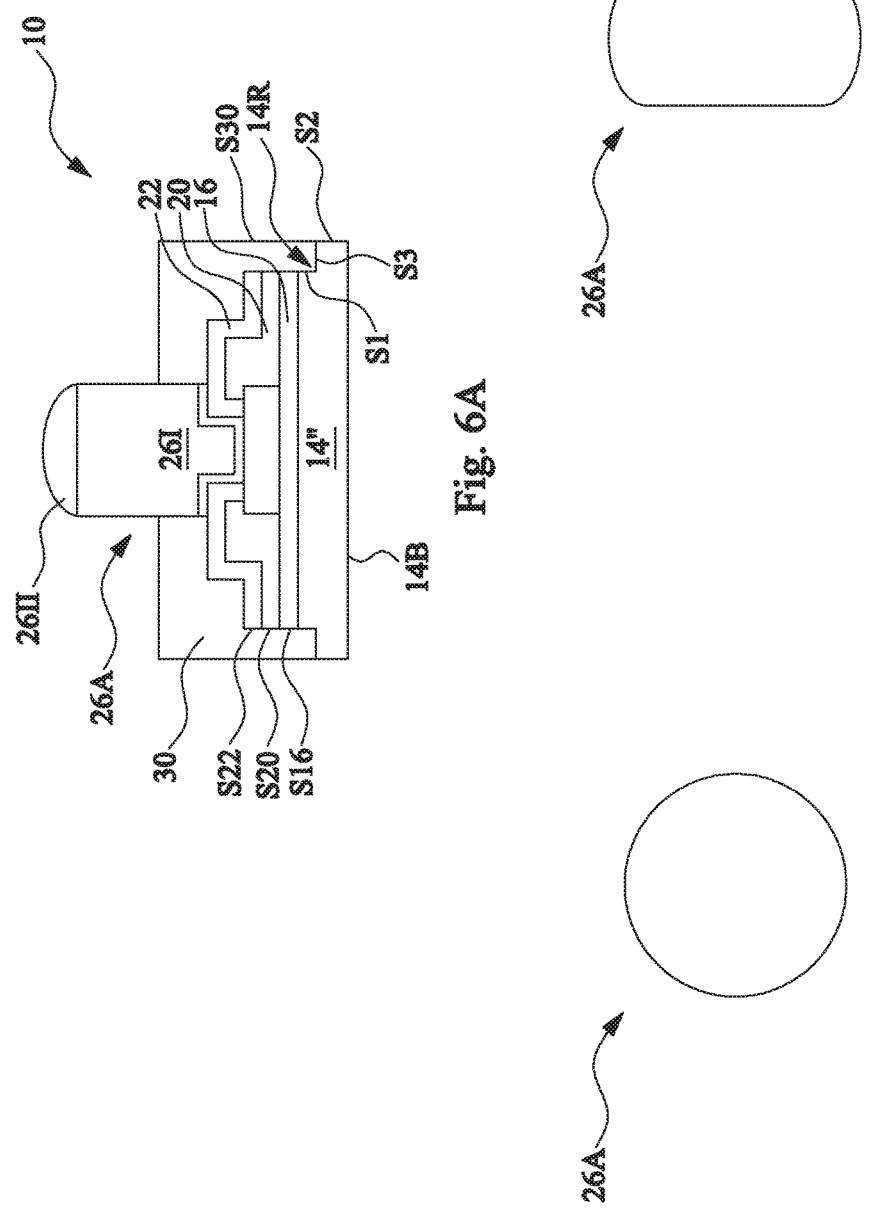

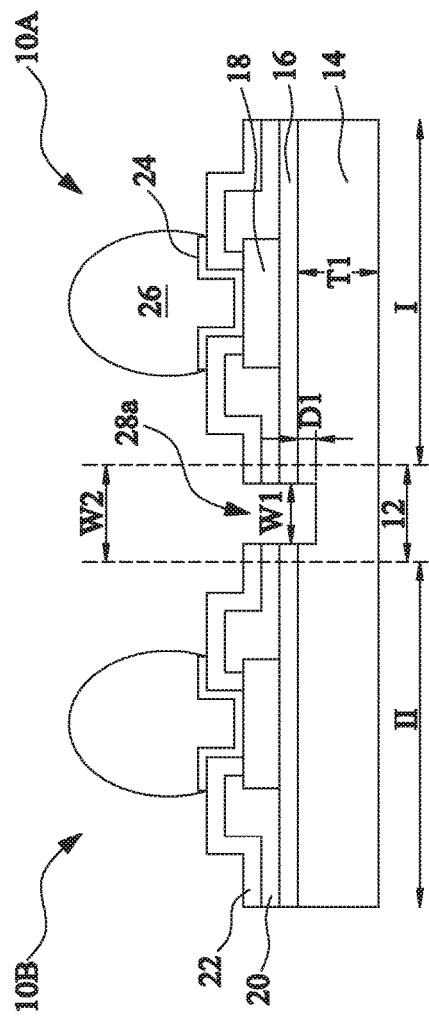
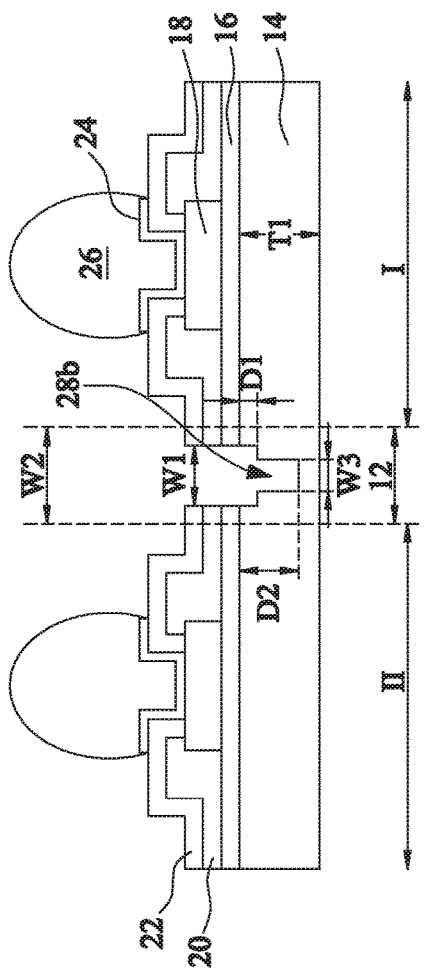
Fig. 7
Fig. 8

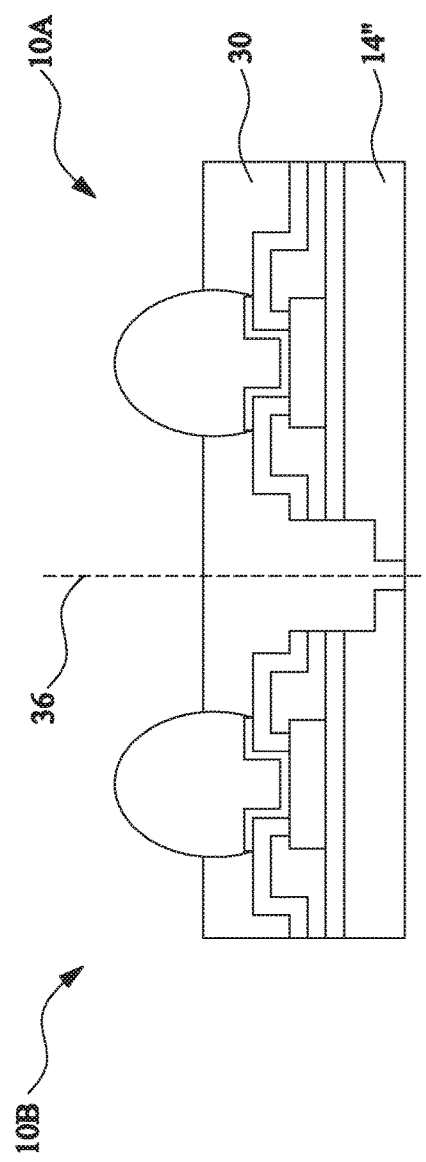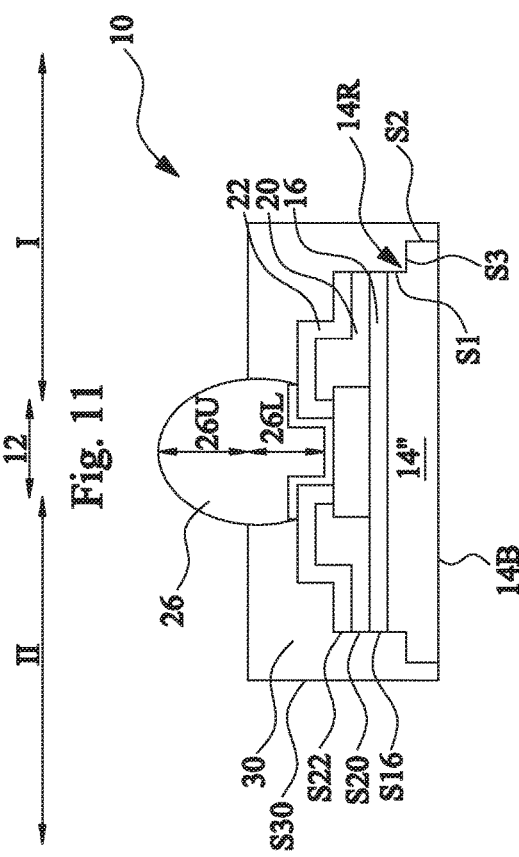

ured Aug. 5, 2014, which is a continuation-
METHOD OF MANUFACTURING SEMICONDUCTOR DEVICE BY APPLYING MOLDING LAYER IN SUBSTRATE GROOVE

PRIORITY CLAIM

This application is a divisional of U.S. application Ser. No. 14/452,219, filed Aug. 5, 2014, which is a continuation-in-part of, and claims the benefit of, U.S. application Ser. No. 13/585,500, filed Aug. 14, 2012, now U.S. Pat. No. 9,275,924, issued Mar. 1, 2016, all of which are hereby incorporated by reference in their entireties.

TECHNICAL FIELD

The disclosure relates to semiconductor packages and, more particularly, to methods of manufacturing semiconductor packages.

BACKGROUND

Modern integrated circuits are made of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Flip-chip packaging utilizes bumps to establish electrical contact between a chip's input/output (I/O) pads and the substrate or lead frame of the package. Structurally, a bump structure usually refers to a bump and an "under bump metallurgy" (UBM) located between the bump and an I/O pad. Wafer level chip scale packaging (WLCSP) is currently widely used for its low cost and relatively simple processes, and ball placement or ball drop process is utilized in the WLCSP technology.

DESCRIPTION OF THE DRAWINGS

FIGS. 1A, 1B, 2A, 2B, 3-6 are schematic diagrams illustrating a method of manufacturing a semiconductor package according to an embodiment;

FIG. 6A is a cross-sectional diagram illustrating an individual chip with a pillar bump formed by using the method as shown in FIGS. 1A-6 according to an embodiment;

FIG. 6B is a top view of the metal pillar shown in FIG. 6A according to an embodiment;

FIG. 6C is a top view of the metal pillar shown in FIG. 6A according to an embodiment;

FIGS. 7-12 are schematic diagrams illustrating a method of manufacturing a semiconductor package according to an embodiment;

DETAILED DESCRIPTION

Figure 3:
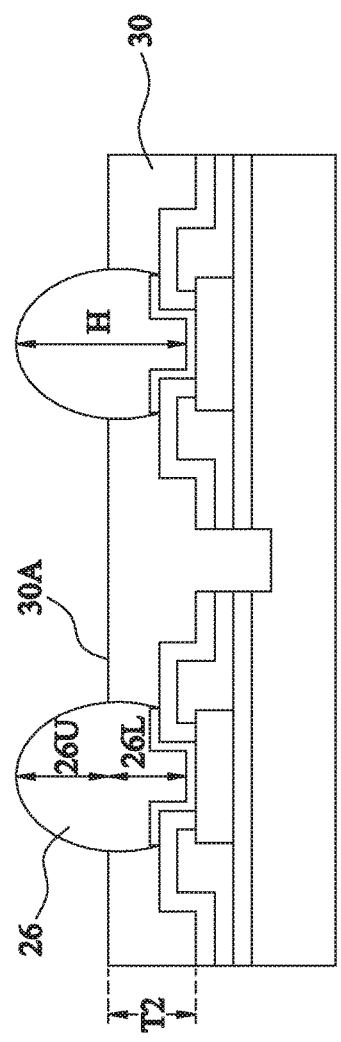

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Embodiments described herein relate to bumps for use with semiconductor devices. As will be discussed below, embodiments are disclosed that utilize a bump for the purpose of attaching one substrate to another substrate, wherein each substrate may be a die, wafer, interposer substrate, printed circuit board, packaging substrate, or the like, thereby allowing for die-to-die, wafer-to-die, wafer-to-wafer, die or wafer to interposer substrate or printed circuit board or packaging substrate, or the like. Throughout the various views and illustrative embodiments, like reference numerals are used to designate like elements.

Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1A-6 are schematic diagrams illustrating a method of manufacturing a semiconductor package according to an embodiment.

With reference to FIG. 1A and FIG. 1B, a semiconductor wafer 100 including a plurality of chips (or dies) 10A and 10B with electrical circuitry and bumps manufactured thereon is provided. FIG. 1A is a top view of the semiconductor wafer 100 with chips 10A and 10B according to an embodiment, and FIG. 1B is a cross-sectional view taken along the line A-A shown in FIG. 1A. The semiconductor wafer 100 comprises an array of chips separated from each other by two sets of intersecting scribe line regions 12. One set of scribe line regions 12 extend along a first direction and a second set of scribe line regions 12 extend along a second direction. In accordance with an embodiment, the chips 10A and 10B have a substantially identical structure. The cross-section view illustrates a first chip 10A formed on a first chip region I and a second chip 10B formed a second chip region II, and the chip regions I and II are separated by the scribe line region 12. The structures of the chips 10A and 10B formed on the chips regions I and II are described in detail below.

In manufacturing the chips 10A and 10B, semiconductor processes are performed on a semiconductor substrate 14 to form an electrical circuitry, a dielectric layer 16, contact pads 18, a first passivation layer 20, a second passivation layer 22, under-bump metallization (UBM) layers 24 and bumps 26. In an at least one embodiment, the layers 16, 20, and 22 are also formed to extend onto the scribe line region 12. The semiconductor substrate 14 may include, for example, bulk silicon, doped or undoped, or an active layer of a semiconductor-on-insulator (SOI) substrate. Other substrates, such as a multi-layered or gradient substrate may also be used. The electrical circuitry (not shown) formed in the semiconductor substrate 14 may be any type of circuitry suitable for a particular application. In some embodiments, the electrical circuitry includes electrical devices having one or more dielectric layers overlying the electrical devices. Metal layers may be formed between dielectric layers to route electrical signals between the electrical devices. Electrical devices may also be formed in one or more dielectric layers. For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The dielectric layer 16 may be formed, for example, of a low dielectric constant (low-K) dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). In some embodiments, the dielectric layer 16 may comprise a plurality of layers of dielectric materials. Metal lines and/or vias (not shown) may be formed inside the dielectric layer 16 to provide an electrical connection to the electrical circuitry formed in the semiconductor substrate 14. In some embodiments, the uppermost dielectric layer is formed of a dielectric material, such as silicon nitride, silicon oxide, undoped silicon glass, and the like.

The contact pads 18 are formed on the dielectric layer 16 to electrically connect the metal lines or vias inside the dielectric layer 16. In some embodiments, the contact pads 18 may be formed of aluminum, aluminum copper, aluminum alloys, copper, copper alloys, or the like. One or more passivation layers, such as the first passivation layer 20 and the second passivation layer 22, are formed over the dielectric layer 16 and patterned to expose portions of the contact pads 18 respectively. In some embodiments, the first passivation layer 20 is formed of a dielectric material, such as undoped silicate glass (USG), silicon nitride, silicon oxide, silicon oxynitride or a non-porous material by any suitable method, such as CVD, PVD, or the like. In an embodiment, the first passivation layer 20 is formed to cover a peripheral portion of each contact pad 18, and to expose a central portion of each contact pad 18 through openings in the first passivation layer 20. The first passivation layer 20 may be a single layer or a laminated layer. The second passivation layer 22 is formed over the first passivation layer 20 and patterned to expose portions of the contact pads 18 respectively. In some embodiments, the second passivation layer 22 may be, for example, a polymer layer, which is patterned to form openings, through which the contact pads 18 are exposed. In some embodiments, the polymer layer is formed of a polymer material such as an epoxy, polyimide, benzocyclobutene (BCB), polybenzoxazole (PBO), or the like, although other relatively soft, often organic, dielectric materials can also be used. The formation methods include spin coating or other methods.

The UBM layers 24 are formed on the exposed portions of the corresponding contact pads 18. In some embodiments, the UBM layer 24 extends to a surface of the second passivation layer 22 adjacent to the contact pad 18. The formation methods of the UBM layer 24 include photoresist coating, lithography, wet or dry etching, and/or the like. In an embodiment, the UBM layer 24 includes at least one metallization layer comprising titanium (Ti), tantalum (Ta), titanium nitride (TiN), tantalum nitride (TaN), copper (Cu), copper alloys, nickel (Ni), tin (Sn), gold (Au), or combinations thereof. In some embodiments, the UBM layer 24 includes at least one Ti-containing layer and at least one Cu-containing layer.

The bumps 26 are formed on the corresponding UBM layers 24. The bump 26 can be a spherical bump or a pillar bump formed of a conductive material including at least one of solder, Cu, Ni or Au. In an embodiment, the bump 26 is a solder bump formed by attaching a solder ball to the UBM layer 24 and then thermally reflowing the solder material. In an embodiment, the solder bump is formed by plating a solder layer using photolithography technologies followed by reflow processes. In an embodiment, the solder bump has a diameter greater than about 200 μm. In some embodiments, the solder bump includes a lead-free pre-solder layer, SnAg, or a solder material including alloys of tin, lead, silver, copper, nickel, bismuth, or combinations thereof.

With reference to FIG. 2A and FIG. 2B, a grooving process is performed on the wafer 100 to form grooves 28 on the scribe line regions 12. FIG. 2A is a top view of the semiconductor wafer 100 with the grooves 28 according to an embodiment, and FIG. 2B is a cross-sectional view taken along the line B-B shown in FIG. 2A. The grooving process removes portions of the second passivation layer 22, the first passivation layer 20, the dielectric layer 16 and the semiconductor substrate 14 within the scribe line regions 12. In an embodiment, the grooves 28 are formed by irradiating the scribe line regions 12 are with a laser beam. The grooves 28 on the wafer 100 can be formed in a continuous manner on the scribe line regions 12 according to one embodiment, such that the planar layout of the groove 28 is substantially similar to that of the intersecting scribe line regions 12. For example, first sets of grooves 28 extend along the first direction and second sets of grooves extend along the second direction. In some embodiments, the grooves 28 on the wafer 100 can be formed in a discontinuous manner in the scribe line regions 12 and separated from each other by a distance. As a result, at least one groove 28 is formed on the scribe line region 12 between two adjacent chip regions I and II. In an embodiment, the groove 28 of a width W1 penetrates the layers 22, 20 and 16 and reaches to a depth D1 of the semiconductor substrate 14. The depth D1 is less than a thickness T1 of the semiconductor substrate 14, and the width W1 is less than a width W2 of the scribe line region 12. In an embodiment, the depth D1 is equal to or greater than about 10 μm.

Next, as shown in FIG. 3, a molding compound layer 30 is applied on the structure depicted in FIG. 2B to cover the second passivation layer 22 and fill the grooves 28, where each bump 26 is partially buried in the molding compound layer 30. In an embodiment, the bump 26 including the lower portion 26L and the upper portion 26U, and the molding compound layer 30 is in physical contact with a lower portion 26L of the bump 26, while the upper portion 26U of the bump 26 is exposed and protrudes from a top surface 30A of the molding compound layer 30. In some embodiments, the molding compound layer 30 may be in physical contact with the second passivation layer 22 and/or the UBM layers 24. In some embodiments, the thickness (T2) of the molding compound layer 30 is between about ¼ to ¾ of the height (H) of the bump 26. In an embodiment, the molding compound layer 30 is formed by applying a liquid molding compound and performing a curing process to cure and solidify the liquid molding compound. In some embodiments, a release film or a soft material may be applied on the liquid molding compound. Pressure is applied on the release film on the liquid molding compound, so that a portion of the bump 26 is pressed into the release film. Furthermore, the pressure applied on the release film may push some of liquid molding compound downward. While the pressure is applied to the release film pushing against the bump and the liquid molding compound, a curing may be performed to cure and solidify liquid molding compound. Thereafter, the release film is peeled off the molding compound layer 30.

Figure 4:
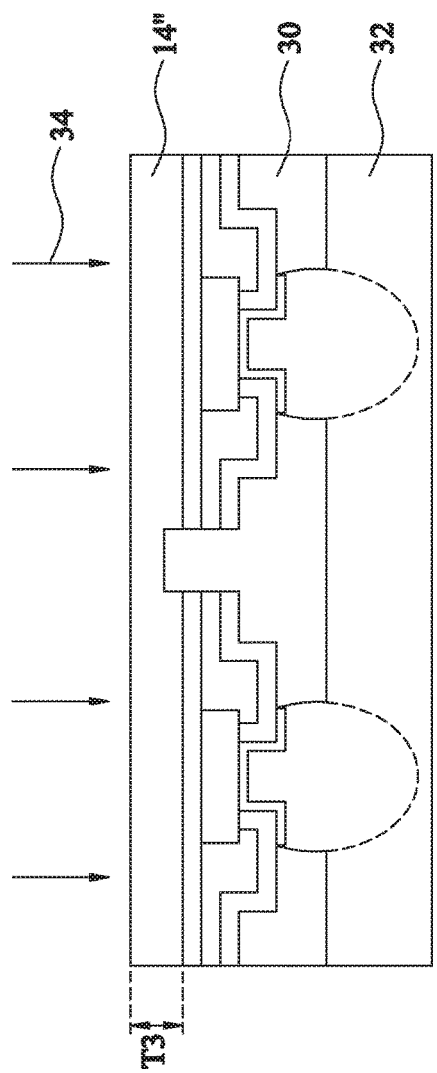

Then, as shown in FIG. 4, the wafer 100 is positioned upside down and attached to a tape 32, followed by performing a grinding process 34 on the backside of the semiconductor substrate 14, so as to thin down the thickness of the semiconductor substrate 14. In an embodiment, the thinned substrate 14" has a thickness T3 which is less than the thickness T1, but greater than the depth D1 of the groove 28.

After detaching the tape 32 as depicted in FIG. 5, a singulation process is performed on the scribe line regions 12 to separate the individual chips 10 from the wafer 100. As depicted in FIG. 5, the dotted line 36 indicates the singulation process performed on the scribe line region 12, which passes through the molding compound layer 30 within the groove 28 and passes through the semiconductor substrate 14 underlying the groove 28. After the singulation process, an example individual chip 10 is shown as FIG. 6. The molding compound layer 30 covers the lower portion 26L of the bump 26, the surface of the second passivation layer 22, and the sidewalls S22, S20 and S16 of the layers 22, 20 and 16. In addition, in the individual chip 10, the thinned substrate 14" includes an upper sidewall S1 adjacent to the sidewall S16 of the dielectric layer 16, a lower sidewall S2 adjacent to the backside 14B of the thinned substrate 14", and a surface region S3 extending from the upper sidewall S1 to the lower sidewall S2. The upper sidewall S1 and the surface region S3 are parts of the groove 28 created by the grooving process, resulting in a recess region 14R at the edge of the thinned substrate 14". The lower sidewall S2 is formed by the singulation process.

In an embodiment, the upper sidewall S1 is substantially leveled with at least one of the sidewalls S16, S20 and S22 of the layers 16, 20 and 22, and the lower sidewall S2 is substantially leveled with the sidewall S30 of the molding compound layer 30. In an embodiment, the upper sidewall S1 has the depth substantially the same as the depth D1. In an embodiment, the molding compound layer 30 covers the upper sidewall S1 and the surface region S3 of the thinned substrate 14". In an embodiment, the molding compound layer 30 fills the recess region 14R of the thinned substrate 14". The individual chips 10 may be used in many different situations. For example, the individual chip 10 may be used in a die-to-die bonding configuration, a die-to-wafer bonding configuration, die-level packaging, or the like. In some embodiments, the individual chip 10 is flipped upside down and attached to another substrate, for example, a chip, an interposer, a printed circuit board (PCB), or any other package substrates.

According to the embodiments depicted in FIG. 6, the molding compound layer 30 fully covers the upper sidewall S1 and surface region S3 of the semiconductor substrate 14 adjacent to the chip edge to provide the bump 26 with a strong adhesive strength so as to eliminate the chip crack issue during the singulation process. Also the molding compound layer 30 covers the lower portion 26L of the bump 26, which can provide a strong package structure for attaching to another substrate. Moreover, using laser grooving process prior to the chip singulation process can eliminate or reduce the initial crack points in the dielectric layer 16, the passivation layers 20 and 22 and the edge of the chip 10 so that the device reliability is improved.

For achieving fine pitch requirements, the bump 26 can be formed as a pillar bump according to some embodiments. FIG. 6A is a cross-sectional diagram illustrating the individual chip 10 with a pillar bump 26A. In an embodiment, the pillar bump 26A includes a metal pillar 26I formed on the UBM layer 24 and a cap layer 26II formed on the metal pillar 26I. The molding compound 30 covers a lower portion of the pillar bump 26A, while exposing an upper portion of the pillar bump 26A. In an embodiment, the molding compound 30 covers a lower portion of the metal pillar 26I, while exposing the upper portion of the metal pillar 26I and exposing the cap layer 26II.

The metal pillar 26I is a copper according to some embodiments. The copper pillar is intended to include substantially a material including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. In an exemplary embodiment, the metal pillar 26I has a diameter less than about 50 μm. The thickness of the metal pillar 26I is less than about 50 μm, although the thickness may be greater or smaller.

The cap layer 26II is formed on the top of the metal pillar 26I. The metal cap layer 26II can include a solder layer, a metal layer, or combinations thereof. In an embodiment, the cap layer 26II is a solder layer made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. Once a solder layer of tin has been formed on the structure, a reflow may be performed in order to shape the solder material into the desired shape. In an embodiment, the cap layer 26II includes a metal layer made of nickel, tin, tin-lead (SnPb), gold (Au), silver, palladium (Pd), indium (In), nickel-palladium-gold (NiPdAu), nickel-gold (NiAu) or other similar materials or alloy. In an embodiment, the cap layer 26II includes a nickel layer and a solder layer. In an exemplary embodiment, the thickness of the cap layer 26II is about 1 µm to about 5 µm, although the thickness may be greater or smaller.

In manufacturing the pillar bump 26A, the metal pillar 26I can be formed as a round pillar, an oval pillar or an elongated pillar according to some embodiments. FIG. 6B is a top view of the metal pillar 26I formed of a round shape according to an embodiment. FIG. 6C is a top view of the metal pillar 26I formed of an elongated shape with two parallel sides and two curved ends according to an embodiment.

FIGS. 7~12 are schematic diagrams illustrating a method of manufacturing a semiconductor package according to an embodiment. Unless specified otherwise, the reference numerals in these embodiments represent like elements in the embodiments illustrated in FIGS. 1-6.

With reference to FIG. 7, a first grooving process is performed on the wafer 100 to form a first groove 28a on the scribe line region 12. The first grooving process removes portions of the second passivation layer 22, the first passivation layer 20, the dielectric layer 16 and the semiconductor substrate 14 within the scribe line regions 12. In an embodiment, the first groove 28a of a width W1 penetrates the layers 22, 20 and 16 and reaches to a depth D1 of the semiconductor substrate 14. The depth D1 is less than the thickness T1 of the semiconductor substrate 14, and the width W1 is less than the width W2 of the scribe line region 12. In an embodiment, the depth D1 is equal to or greater than about 10 µm.

Next, as shown in FIG. 8, a second grooving process is performed on the wafer 100 to form a second groove 28b inside the first groove 28a on the scribe line region 12. The first grooving process removes portions of the semiconductor substrate 14 underlying the first groove 28a. In an embodiment, the second groove 28b of a width W3 penetrates the semiconductor substrate 14 and reaches to a depth D2 of the semiconductor substrate 14. In some embodiments, the depth D2 satisfies the formula: D1<D2<T1, and the width W3 satisfies the formula: W3<W1<W2.

Figure 9:
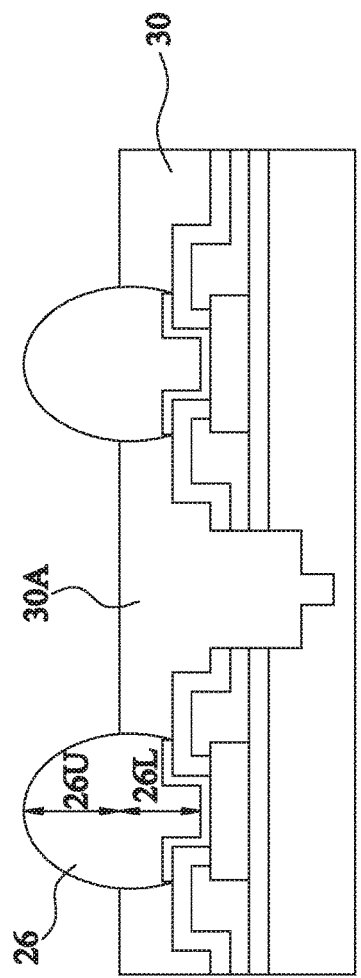

Next, as shown in FIG. 9, a molding compound layer 30 is applied on the resulting structure depicted in FIG. 8 to cover the second passivation layer 22 and fill the grooves 28a and 28b, where each bump 26 is partially buried in the molding compound layer 30. In an embodiment, the molding compound layer 30 is in physical contact with a lower portion 26L of the bump 26, while the upper portion 26U of the bump 26 is exposed and protrudes from a top surface 30A of the molding compound layer 30. In some embodiments, the molding compound layer 30 may be in physical contact with the second passivation layer 22 and/or the UBM layers 24.

Figure 10:
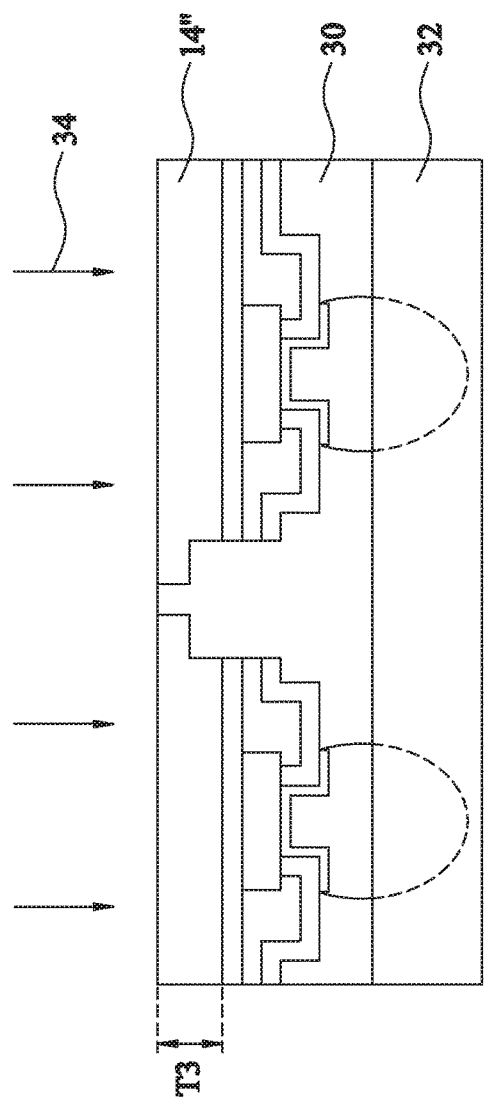

Then, as shown in FIG. 10, the wafer 100 is positioned upside down and attached to a tape 32, followed by performing a grinding process 34 on the backside of the semiconductor substrate 14, so as to thin down the thickness of the semiconductor substrate 14. The thinned substrate 14" has a thickness T3 which is less than the thickness T1. In an embodiment, the thickness T3 is substantially equal to the depth D3 of the second groove 28b, such that the molding compound layer 30 is exposed on the backside of the thinned substrate 14". In some embodiments, the thickness T3 is greater than the depth D3 of the second groove 28b. After detaching the tape 32, a singulation process is performed on the scribe line regions 12 to separate the individual chips 10 from the wafer 100. As depicted in FIG. 11, the dotted line 36 indicates the singulation process performed on the scribe line region 12, which passes through the molding compound layer 30 within the grooves 28a and 28b and passes through the semiconductor substrate 14 underlying the groove 28b.

After the singulation process, the individual chip 10 is shown as FIG. 12. The molding compound layer 30 covers the lower portion 26L of the bump 26, the surface of the second passivation layer 22, and the sidewalls S22, S20 and S16 of the layers 22, 20 and 16. In addition, in the individual chip 10, the thinned substrate 14" includes an upper sidewall S1 adjacent to the sidewall S16 of the dielectric layer 16, a lower sidewall S2 adjacent to the backside 14B of the thinned substrate 14", and a surface region S3 extending from the upper sidewall S1 to the lower sidewall S2. The upper sidewall S1 and the surface region S3 are parts of the first groove 28a created by the first grooving process, resulting in a recess region 14R at the edge of the thinned substrate 14". The lower sidewall S2 is parts of the second groove 28b created by the second grooving process. In an embodiment, the molding compound layer 30 covers the upper sidewall S1, the surface region S3 and the lower sidewall S2 of the thinned substrate 14". In an embodiment, the molding compound layer 30 covers and fills the recess region 14R of the thinned substrate 14".

Figure 12A:
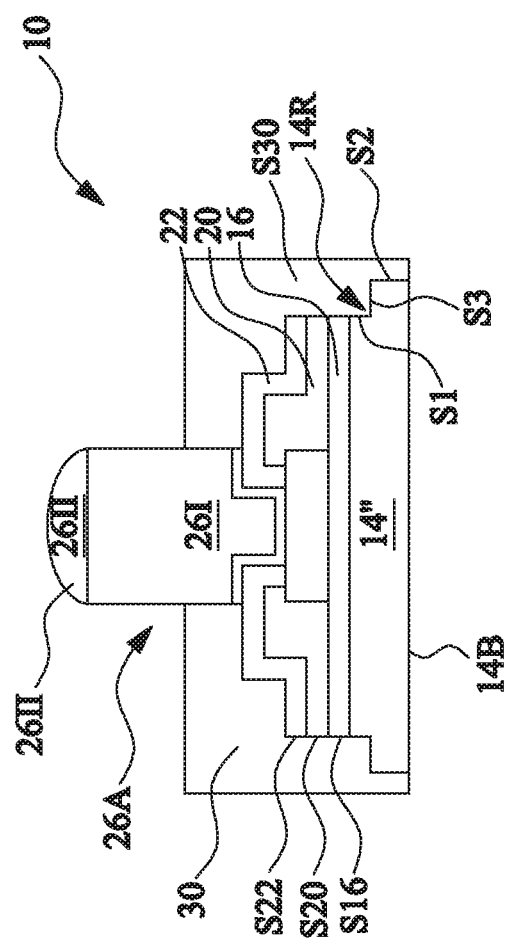
FIG. 12A is a cross-sectional diagram illustrating an individual chip with a pillar bump formed by using the method as shown in FIGS. 7-12 according to an embodiment.

For achieving fine pitch requirements, the bump 26 can be formed as a pillar bump according to some embodiments. FIG. 12A is a cross-sectional diagram illustrating the individual chip 10 with a pillar bump 26A. In an embodiment, the pillar bump 26A includes a metal pillar 26I formed on the UBM layer 24 and a cap layer 26II formed on the metal pillar 26I. The molding compound 30 covers a lower portion of the pillar bump 26A, while exposing an upper portion of the pillar bump 26A. In an embodiment, the molding compound 30 covers a lower portion of the metal pillar 26I, while exposing the upper portion of the metal pillar 26I and exposing the cap layer 26II.

The metal pillar 26I is a copper according to some embodiments. The copper pillar is intended to include substantially a material including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. In an exemplary embodiment, the metal pillar 26I has a diameter less than about 50 µm. The thickness of the metal pillar 26I is less than about 50 µm, although the thickness may be greater or smaller. In manufacturing the pillar bump 26A, the metal pillar 26I can be formed as a round pillar, an oval pillar or an elongated pillar as illustrated in FIG. 6B and FIG. 6C according to some embodiments.

The cap layer 26II is formed on the top of the metal pillar 26I. The metal cap layer 26II can include a solder layer, a metal layer, or combinations thereof. In an embodiment, the cap layer 26II is a solder layer made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. Once a solder layer of tin has been formed on the structure, a reflow may be performed in order to shape the solder material into the desired shape. In an embodiment, the cap layer 26II includes a metal layer made of nickel, tin, tin-lead (SnPb), gold (Au), silver, palladium (Pd), indium (In), nickel-palladium-gold (NiPdAu), nickel-gold (NiAu) or other similar materials or alloy. In an embodiment, the cap layer 26II includes a nickel layer and a solder layer. In an exemplary embodiment, the thickness of the cap layer 26II is about 1 µm to about 5 µm, although the thickness may be greater or smaller.

Figure 13:
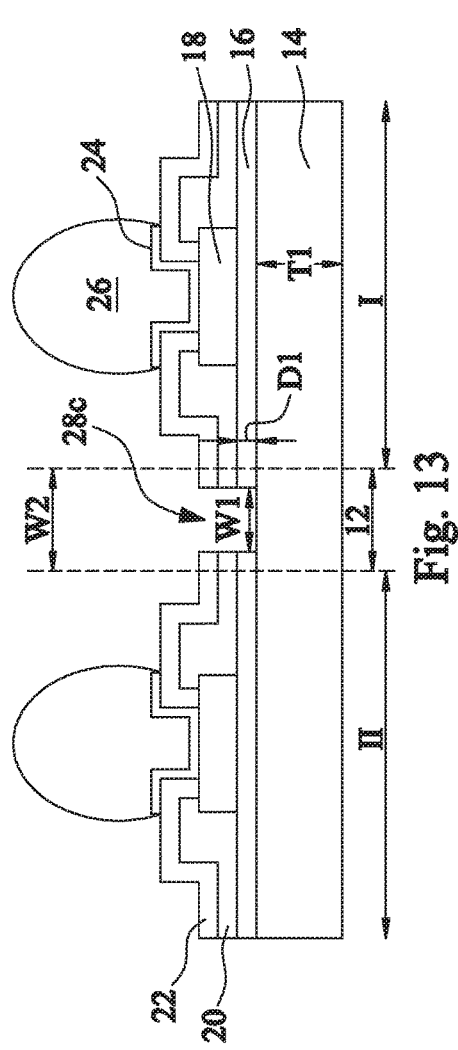
FIGS. 13-15 are schematic diagrams illustrating a method of manufacturing a semiconductor package according to an embodiment.
Figure 14:
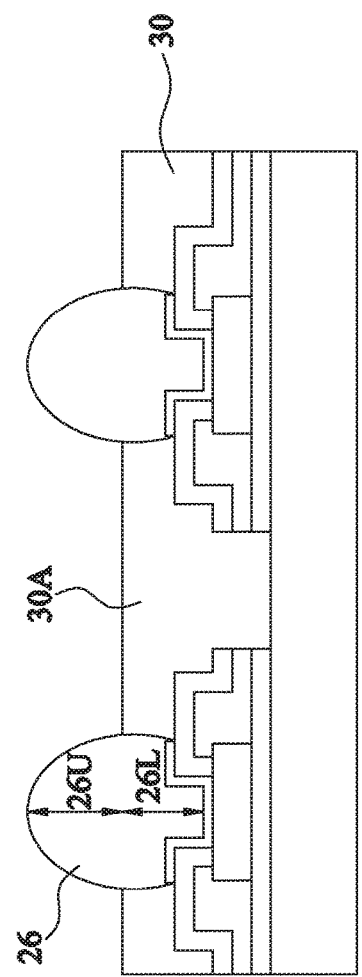
Figure 15:
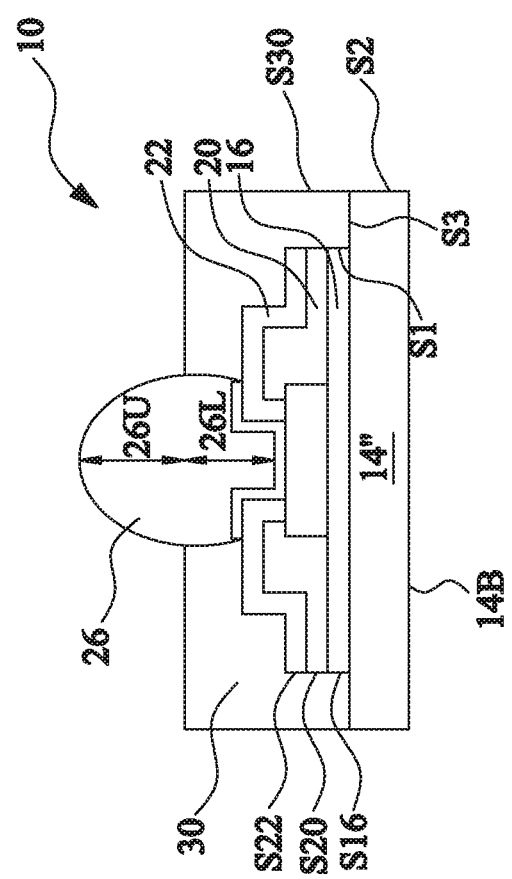

FIGS. 13-15 are schematic diagrams illustrating a method of manufacturing a semiconductor package according to an embodiment. Unless specified otherwise, the reference numerals in these embodiments represent like elements in the embodiments illustrated in FIGS. 1-6.

With reference to FIG. 13, a grooving process is performed on the wafer 100 to form a groove 28c on the scribe line region 12. The grooving process removes portions of the second passivation layer 22, the first passivation layer 20 and the dielectric layer 16 within the scribe line regions 12, and the surface of the semiconductor substrate 14 is exposed. In an embodiment, the groove 28c of a width W1 penetrates the layers 22, 20 and 16. The width W1 is less than the width W2 of the scribe line region 12.

Next, as shown in FIG. 14, a molding compound layer 30 is applied on the resulted structure to cover the second passivation layer 22 and fill the groove 28c, where each bump 26 is partially buried in the molding compound layer 30. In an embodiment, the molding compound layer 30 is in physical contact with a lower portion 26L of the bump 26, while the upper portion 26U of the bump 26 is exposed and protrudes from a top surface 30A of the molding compound layer 30. In some embodiments, the molding compound layer 30 may be in physical contact with the second passivation layer 22 and/or the UBM layers 24.

After thinning process and singulation process, the individual chip 10 is shown as FIG. 15. The molding compound layer 30 covers the lower portion 26L of the bump 26, the surface of the second passivation layer 22, and the sidewalls S22, S20 and S16 of the layers 22, 20 and 16. In addition, in the individual chip 10, the sidewall S2 of the thinned substrate 14" is substantially leveled with the sidewall S30 of the molding compound layer 30.

Figure 15A:
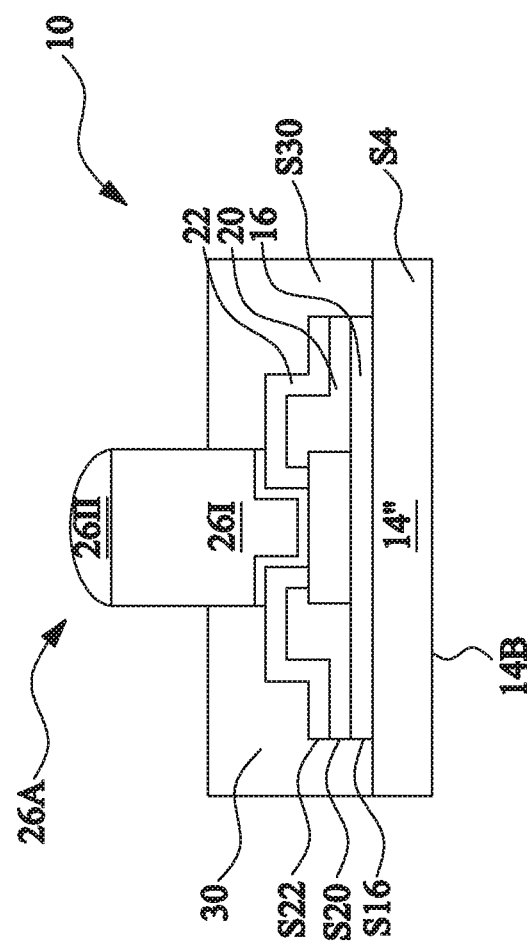
FIG. 15A is a cross-sectional diagram illustrating an individual chip with a pillar bump formed by using the method as shown in FIGS. 13-15 according to an embodiment.

For achieving fine pitch requirements, the bump 26 can be formed as a pillar bump according to some embodiments. FIG. 15A is a cross-sectional diagram illustrating the individual chip 10 with a pillar bump 26A. In an embodiment, the pillar bump 26A includes a metal pillar 26I formed on the UBM layer 24 and a cap layer 26II formed on the metal pillar 26I. The molding compound 30 covers a lower portion of the pillar bump 26A, while exposing an upper portion of the pillar bump 26A. In an embodiment, the molding compound 30 covers a lower portion of the metal pillar 26I, while exposing the upper portion of the metal pillar 26I and exposing the cap layer 26II.

The metal pillar 26I is a copper according to some embodiments. The copper pillar is intended to include substantially a material including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. In an exemplary embodiment, the metal pillar 26I has a diameter less than about 50 µm. The thickness of the metal pillar 26I is less than about 50 µm, although the thickness may be greater or smaller. In manufacturing the pillar bump 26A, the metal pillar 26I can be formed as a round pillar, an oval pillar or an elongated pillar as illustrated in FIG. 6B and FIG. 6C according to some embodiments.

The cap layer 26II is formed on the top of the metal pillar 26I. The metal cap layer 26II can include a solder layer, a metal layer, or combinations thereof. In an embodiment, the cap layer 26II is a solder layer made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. Once a solder layer of tin has been formed on the structure, a reflow may be performed in order to shape the solder material into the desired shape. In an embodiment, the cap layer 26II includes a metal layer made of nickel, tin, tin-lead (SnPb), gold (Au), silver, palladium (Pd), indium (In), nickel-palladium-gold (NiPdAu), nickel-gold (NiAu) or other similar materials or alloy. In an embodiment, the cap layer 26II includes a nickel layer and a solder layer. In an exemplary embodiment, the thickness of the cap layer 26II is about 1 µm to about 5 µm, although the thickness may be greater or smaller.

One aspect of this description relates to a method of forming a semiconductor package. The method includes depositing a passivation layer overlying a semiconductor substrate, wherein the semiconductor substrate comprises a first chip region, a second chip region and a scribe line region positioned between the first chip region and the second chip region. The method further includes forming a bump overlying the passivation layer on at least one of the first chip region or the second chip region, wherein the bump comprises a copper pillar and a cap layer. The method further includes forming a groove passing through the passivation layer on the scribe line region, wherein the groove extends into the semiconductor substrate to expose a stepped sidewall of the semiconductor substrate. The method further includes applying a molding compound layer to cover the passivation layer and a lower portion of the bump and fill the groove. The method further includes singulating along the scribe line region to separate the first chip region from the second chip region.

Another aspect of this description relates to a method of forming a semiconductor package. The method includes forming a groove passing through a passivation layer on a scribe line region of a substrate, wherein scribe line region is located between a first chip region and a second chip region of the substrate. Forming the groove includes performing a first grooving process to remove a portion of the passivation layer and a first portion of the substrate, wherein the first grooving process forms a first groove having a first width and a firth depth. Forming the groove further includes performing a second grooving process to remove a second portion of the substrate below the first portion of the substrate, wherein the second grooving process forms a second groove having a second width different from the first width. The method further includes applying a molding compound layer to cover the passivation layer and to fill the first groove and the second groove, wherein the molding compound layer contacts a sidewall of the first groove and a sidewall of the second groove.

Still another aspect of this description relates to a method of forming a semiconductor package. The method includes forming a groove passing through a passivation layer on a scribe line region of a substrate, wherein scribe line region is located between a first chip region and a second chip region of the substrate. Forming the groove includes removing a portion of the passivation layer and an underlying first portion of the substrate to form a first groove having a first width and a first depth. Forming the groove further includes extending the first depth of the first groove to form a second groove having a second width less than the first width and a second depth greater than the first depth. The method further includes applying a molding compound layer to cover the passivation layer and to fill the first groove and the second groove. The method further includes thinning the substrate to expose the molding compound layer in the second groove; and singulating along the scribe line region to separate the first chip region from the second chip region.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A method of forming a semiconductor package, comprising:
    depositing a passivation layer overlying a top surface of a semiconductor substrate, wherein the semiconductor substrate comprises a first chip region, a second chip region and a scribe line region positioned between the first chip region and the second chip region;
    forming a bump overlying the passivation layer on at least one of the first chip region or the second chip region, wherein the bump comprises a copper pillar and a cap layer;
    forming a groove passing through the passivation layer on the scribe line region, wherein the groove extends into the semiconductor substrate to expose a stepped sidewall of the semiconductor substrate, the stepped sidewall includes a first surface extending in a first direction and two sidewall surfaces extending in a second direction perpendicular to the first direction, and the first surface is between the two sidewall surfaces, and the first direction is parallel to the top surface of the semiconductor substrate;
    applying a molding compound layer to cover the passivation layer and a lower portion of the bump and fill the groove; and
    singulating along the scribe line region to separate the first chip region from the second chip region.

2. The method of claim 1, wherein the formation of the groove comprising:
    performing a first grooving process to form the groove passing through the passivation layer and extending to a first depth of the semiconductor substrate on the scribe line region, wherein the method further comprises:
    performing a second grooving process to form another groove underlying the groove extending to a second depth of the semiconductor substrate on the scribe line region.

3. The method of claim 2, wherein the groove has a first width, the another groove has a second width, and the first width is greater than the second width.

4. The method of claim 1, wherein applying the molding compound layer comprises applying a liquid molding compound on the semiconductor substrate and curing the liquid molding compound.

5. The method of claim 1, further comprising thinning the semiconductor substrate before singulating.

6. The method of claim 5, wherein thinning the semiconductor substrate comprises exposing the molding compound in the groove.

7. The method of claim 1, wherein applying the molding compound layer comprises exposing a top portion of the bump.

8. The method of claim 1, wherein applying the molding layer comprises applying the molding layer after forming the bump.

9. A method of forming a semiconductor package, comprising:
    forming a groove passing through a passivation layer on a scribe line region of a top surface of a substrate, wherein the scribe line region is located between a first chip region and a second chip region of the substrate, and forming the groove comprises:
        performing a first grooving process to remove a portion of the passivation layer and a first portion of the substrate, wherein the first grooving process forms a first groove having a first width and a first depth, and
        performing a second grooving process to remove a second portion of the substrate below the first portion of the substrate, wherein the second grooving process forms a second groove having a second width different from the first width, the first groove and the second groove define a stepped sidewall in the substrate, and the stepped sidewall comprises:
            a first sidewall surface extending in a first direction,
            a second sidewall surface extending in the first direction, and
            a step surface between the first sidewall surface and the second sidewall surface, wherein the step surface extends in a second direction perpendicular to the first direction, and the second direction is parallel to the top surface of the substrate; and
    applying a molding compound layer to cover the passivation layer and to fill the first groove and the second groove, wherein the molding compound layer contacts a sidewall of the first groove and a sidewall of the second groove.

10. The method of claim 9, further comprising forming a bump structure over the passivation layer in at least one of the first chip region or the second chip region.

11. The method of claim 10, wherein applying the molding compound layer comprises partially covering the bump structure, and a portion of the bump structure protrudes above a top surface of the molding compound layer.

12. The method of claim 9, further comprising thinning the substrate from a surface opposite the passivation layer.

13. The method of claim 12, wherein thinning the substrate comprises exposing the molding compound layer in the second groove.

14. The method of claim 12, further comprising singulating along the scribe line region to separate the first chip region from the second chip region.

15. The method of claim 14, wherein singulating along the scribe line region comprises performing the singulation process only through the molding compound layer.

16. The method of claim 9, wherein performing the second grooving process comprises forming the second groove having the second width less than the first width.

17. The method of claim 9, wherein performing the first grooving processes comprises forming the first groove having the first width less than a width of the scribe line region.

18. The method of claim 9, wherein performing the second grooving process comprises forming the second groove having a second depth less than a thickness of the substrate.

19. A method of forming a semiconductor package, comprising:
- forming a groove passing through a passivation layer on a scribe line region of a substrate, wherein the scribe line region is located between a first chip region and a second chip region of the substrate, and forming the groove comprises:
  - removing a portion of the passivation layer and an underlying first portion of the substrate to form a first groove having a first width and a first depth,
  - extending the first depth of the first groove to form a second groove having a second width less than the first width and a second depth greater than the first depth;
- applying a molding compound layer to cover the passivation layer and to fill the first groove and the second groove;
- thinning the substrate to expose the molding compound layer in the second groove; and
- singulating along the scribe line region to separate the first chip region from the second chip region, wherein singulating along the scribe line region comprises singulating only through the molding compound layer.

20. The method of claim 19, further comprising forming a bump structure on the passivation layer in at least one of the first chip region or the second chip region, wherein applying the molding compound layer comprises exposing at least a portion of the bump structure above a top surface of the molding compound layer.

* * * * *